(12) United States Patent
Lin et al.

(10) Patent No.: US 8,385,142 B1
(45) Date of Patent: Feb. 26, 2013

(54) FLEXIBLE DATA STROBE SIGNAL BUS STRUCTURE FOR WIREBOND AND FLIP-CHIP PACKAGING

(75) Inventors: Guu Lin, San Jose, CA (US); Yen-Fu Lin, San Jose, CA (US); Mark W. Fiester, Redwood City, CA (US); Stephanie T. Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 763 days.

(21) Appl. No.: 12/464,783

(22) Filed: May 12, 2009

(51) Int. Cl.
*G11C 5/06* (2006.01)

(52) U.S. Cl. .......................... 365/193; 365/63

(58) Field of Classification Search ............. 365/230.05, 365/63, 51, 189.17, 193; 257/737, 666, 738
See application file for complete search history.

(56) References Cited

U.S. PATENT DOCUMENTS 6,307,755 B1 * 10/2001 Williams et al. .............. 361/813
6,806,733 B1 * 10/2004 Pan et al. ........................ 326/41

* cited by examiner

*Primary Examiner* — Douglas King
(74) *Attorney, Agent, or Firm* — Womble Carlyle Sandridge & Rice, LLP

(57) ABSTRACT

An integrated circuit with a flexible data strobe signal (DQS) bus structure is presented. The integrated circuit has a number of input/output (I/O) modules with a number of data pins to receive and transmit data. In addition, a subset of the I/O modules also have a data strobe pin. The input/output modules are connected to data strobe signal buses having a fixed configuration. The configuration of the fixed DQS bus groups a number of data pins with a corresponding data strobe pin and the grouping of data pin spans multiple I/O modules. The integrated circuit also has a flexible data bus connected to the I/O modules. Data pins of I/O modules of a second integrated circuit are mapped a subset of the data pins of corresponding I/O modules of the integrated circuit. The flexible data strobe signal bus enables selection of the subset of data pins in the integrated circuit.

19 Claims, 5 Drawing Sheets

FLEXIBLE DATA STROBE SIGNAL BUS STRUCTURE FOR WIREBOND AND FLIP-CHIP PACKAGING

BACKGROUND

When designing a family of field-programmable gate array (FPGA) products, a major benefit to original equipment manufacturers would be to provide the FPGA family of products implemented using a given semiconductor package, or in other words allowing vertical migration in package matrix. This feature allows a single board to be designed and used for the family of products. A product needing additional logic utilization can switch to a part that has a larger density, but keeps the same board footprint. Ideally, it is desirable to vertically integrate different sized FPGAs into a given package and be able to use this packaged integrated circuit for all expected variations in the FPGAs. When implementing a design using a given package, it is desirable to keep the package and I/O pin configuration exactly the same for all logic configurations used by the family of products.

Additionally, it is also desirable to design the FPGA so that the FPGA can support both wirebond and flip-chip package options. Design of the data strobe signal bus for the FPGA gets increasingly complicated in order to accommodate both wirebond and flip chip package options with the same die. For FPGAs of various sizes to be packaged in a single semiconductor package, the wirebonds need to comply with the physical bond wire angle limitation of the wirebond package, as well as have a minimum spacing between adjacent bond wires, which tend to be competing requirements.

It is in this context that embodiments of the invention arise.

SUMMARY

Broadly speaking, the present invention fills these needs by providing a method and apparatus enabling vertical migration between integrated circuits of different sizes and number of input/output pins. It should be appreciated that the present invention can be implemented in numerous ways, including as a method, a system, or a device. Several inventive embodiments of the present invention are described below.

In accordance with one aspect of the invention, an integrated circuit with a flexible data strobe signal (DQS) bus structure is detailed. The integrated circuit has a number of input/output (I/O) modules with a number of data pins to receive and transmit data. In addition, a subset of the I/O modules also have a data strobe pin. The input/output modules are connected to data strobe signal buses having a fixed configuration. The configuration of the fixed DQS bus groups a number of data pins with a corresponding data strobe pin and the grouping of data pins spans multiple I/O modules. The integrated circuit also has a flexible data bus connected to the I/O modules. Data pins of I/O modules of a second integrated circuit, which has fewer I/O modules than the integrated circuit, are mapped to a subset of the data pins of corresponding I/O modules of the integrated circuit. The flexible data strobe signal bus enables selection of the subset of data pins in the integrated circuit.

In accordance with another aspect of the invention, a method for enabling vertical migration between integrated circuits of different sizes and number of input/output pins in the same semiconductor package using a flexible data bus is provided. The input/output modules of the first integrated circuit are assigned to a grouping that includes data strobe pins and has an associated flexible DQS bus. A subset of data pins from each grouping of input/output modules associated with the data strobe pins is selected, where the flexible data strobe signal bus enables the selection of the subset of data pins. Data pins of an input/output module of the second integrated circuit are mapped to the selected data pins from each corresponding grouping of I/O modules. Each input/output module of the second integrated circuit is connected to a fixed DQS bus. The subset of data pins from the first integrated circuit is coupled to a top surface of the semiconductor package.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method enabling vertical migration between integrated circuits (ICs) of different sizes and number of input/output pins in a single package. It will be obvious, however, to one skilled in the art, that the present invention may be practiced without some or all of these specific details. In other instances, well known process operations have not been described in detail in order not to unnecessarily obscure the present invention.

Synchronous dynamic random access memory (SDRAM) was traditionally used in personal computing applications. As processor speeds increased, the overall system performance became limited by the SDRAM performance. Traditional SDRAM architectures were limited by their interfaces, which lead to the creation of double data rate (DDR) and quad data rate (QDR) SDRAM with an improved data interface. DDR, as well as and QDR, SDRAM architectures utilize a data strobe signal (DQS) bus designed to improve the read timing.

The number of input/output (I/O) modules of the integrated circuit (e.g. a programmable logic device such as a field-programmable gate array (FPGA)) is directly proportional to the number of logic elements. A typical DDR I/O module consists of eight data pins (DQ) with an associated data strobe pin used to latch data. Additionally, the DDR input/output module includes a data mask (DM) pin and an optional differential data strobe signal (DQSB) pin.

Embodiments described below disclose a flexible data strobe signal bus for providing the ability to vertically migrate between integrated circuits of different sizes and number of input/output pins in a single package in both wirebond and flip-chip package options by mapping the data pins in such a way as to retain proper functionality. In other words, the described embodiments allow replacement of an integrated circuit of a specified size and I/O pin configuration with another integrated circuit of a different size or I/O pin configuration using the same semiconductor package, thus, the flexible DQS bus enables the board pins to remain the same at the package level, regardless of the size the integrated circuit or the number of I/O pins.

Figure 1A:
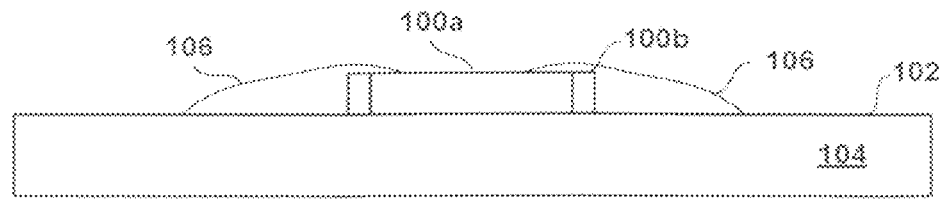
FIG. 1A illustrates a cross-sectional view of an integrated circuit in communication with a top surface of a semiconductor package through a wirebond in accordance with one embodiment of the present invention.

FIG. 1A illustrates a cross-sectional view of an integrated circuit in communication with a top surface of a semiconductor package through a wirebond in accordance with one embodiment of the present invention. The integrated circuit 100 is mounted on a top surface 102 of the semiconductor package 104. As seen from the cross-sectional view, the top surface 102 of the semiconductor package 104 can accommodate integrated circuits 100a and 100b of varying sizes. In one embodiment, the integrated circuit 100a of a specified size is mounted to the top surface 102 of the semiconductor package 104. In another embodiment, the top surface 102 of the semiconductor package 104 accommodates an integrated circuit of larger size 100b. One method of providing electrical communication between the integrated circuit 100 and the semiconductor package 104 is the use of a conductive bond wire 106. For purposes of clarity, the relative thicknesses of the integrated circuit 100 and the semiconductor package 104 are not drawn to scale.

Figure 1B:
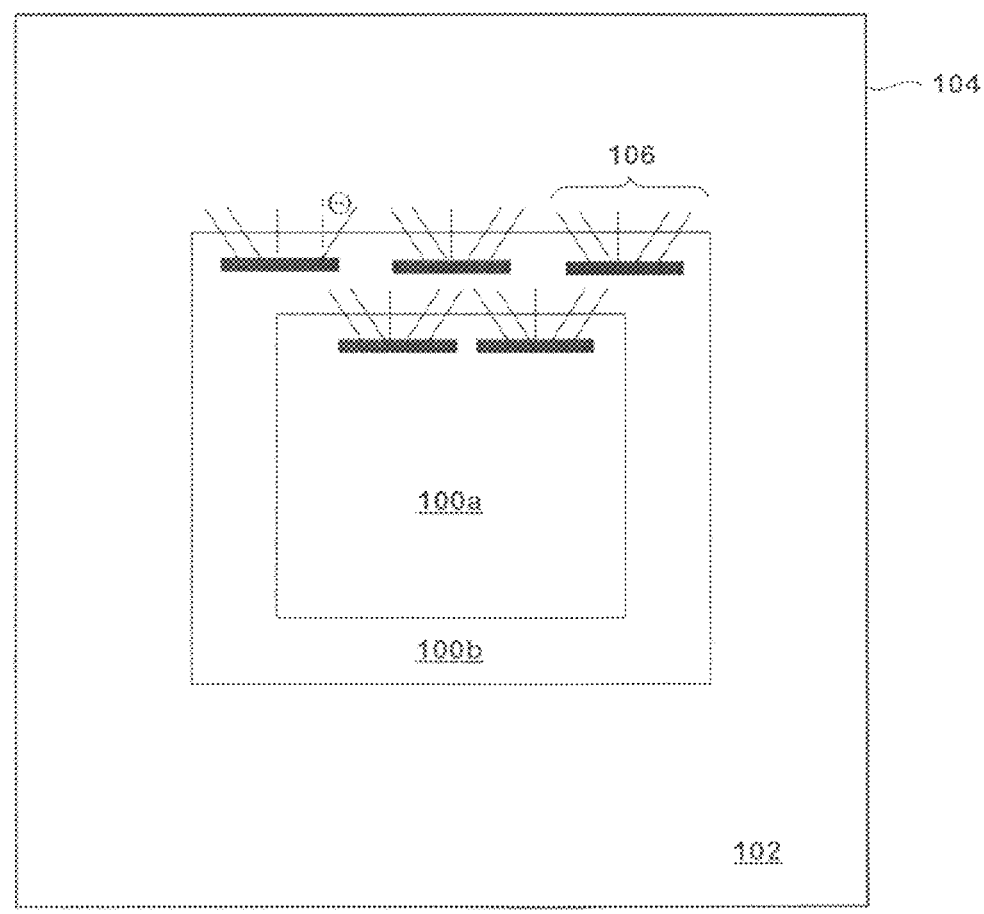
FIG. 1B illustrates a top view of a semiconductor package containing an integrated circuit in accordance with one embodiment of the present invention.

FIG. 1B illustrates a top view of a semiconductor package containing an integrated circuit in accordance with one embodiment of the present invention. A number of conducting bond wires 106 provides electrical communication from the integrated circuit 100 to the top surface 102 of the semiconductor package 104 at a coupling angle Θ. The coupling angle Θ of the bond wire 106 depends on the relative position between the bonding pads of the integrated circuit 100 to the position of the destination points of the bond wires 106 on the top surface 102 of the semiconductor package 104. For manufacturing yield reasons, the coupling angle Θ of the bond wires 106 should be less than a bond wire limitation angle. In one embodiment, the integrated circuit 100 is a FPGA chip. Any FPGA 100 implementation which supports both wirebond and flip-chip packages should provide the flexibility to place the DQ pin groupings in locations that will conform to the bond wire limitation angle for the semiconductor package 104. An exemplary value of bond wire limitation angle is 45°. The exemplary value of the bond wire limitation angle is provided for illustrative purposes and is not limiting as other values of the bond wire limitation angle may be imposed as required by the design.

Figure 2:
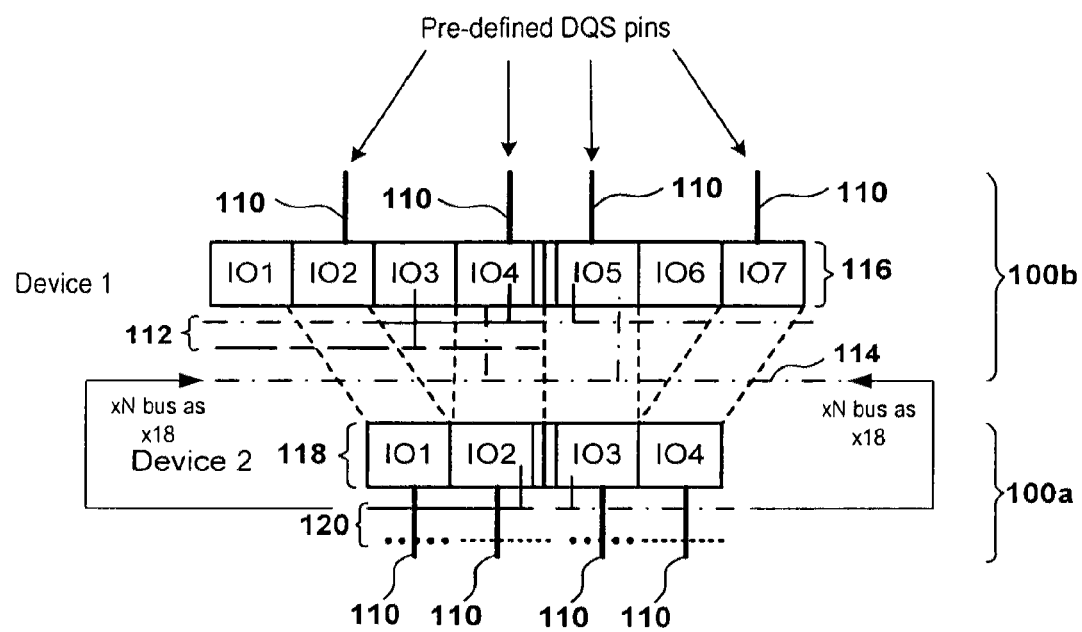
FIG. 2 illustrates one to one direct migration of input/output modules from an integrated circuit to another integrated circuit with an increased number of input/output modules using a flexible data strobe signal bus in accordance with one embodiment of the present invention.

FIG. 2 illustrates one to one direct migration of input/output modules from an integrated circuit to another integrated circuit with an increased number of input/output modules using a flexible data strobe signal bus in accordance with one embodiment of the present invention. The flexible data strobe signal bus 114 provides the data strobe signal to multiple DQ groupings in the integrated circuit 100a and 100b mounted in either a wirebond or a flip-chip package. The IC 100a and 100b uses the data strobe signal to latch data on the DQ pins and the data strobe signal is transmitted using the DQS pins 110 at pre-defined I/O modules 116 and 118. In one embodiment, the first integrated circuit 100b has a number input/output modules 116 that are coupled to a number of fixed DQS buses 112 and a flexible DQS bus 114. The flexible DQS bus 114 described herein provides flexibility to accommodate the physical bond wire angle limitation when using a wirebond package.

The fixed data strobe signal buses 112 and the flexible data strobe signal bus 114 of the first IC 100b are signal buses that provide the data strobe signal to the I/O modules 116 coupled to the signal buses 112 and 114. In another embodiment, the second integrated circuit 100a with fewer input/output modules 118 than the first IC 100b. The I/O modules 118 of the second IC 100a are coupled to a set of fixed DQS buses 120. Embodiments described below map data pins from the I/O modules 118 of the second integrated circuit 100a to a subset of data pins of corresponding I/O modules 116 of the first integrated circuit 100a through the flexible bus 114.

A subset of the I/O modules 116 first IC 100b, as well as the I/O modules 118 of the second IC 100a have a data strobe pin 110. The integrated circuits 100a and 100b use dedicated DQS pins 110 to transmit the data strobe signal and the DQS pins 110 are migrated or mapped from the second integrated circuit 100a to the first integrated circuit 100b during the design phase. For example, the I/O modules 116 of the first IC 100b which have a DQS pin 110 are: IO2; IO4; IO5; and IO7. Each DQS pin 110 provides the data strobe signal through a DQS bus 112 and 114, to a number I/O modules 116 with DQ pin groupings ranging from four DQ pins to thirty-six DQ pins.

The fixed data buses 112 and 120 are configured to provide the data strobe signal to a fixed number of input/output modules 116 and 118 and latch data on the associated DQ pins. The DQS buses 112 and 120 are defined by the number of associated DQ pins that receive the data strobe signal from each DQS pin 110. For example, a fixed data strobe signal bus 112 and 120 transmitting the data strobe signal from each DQS pin 110 to eight data pins (or bits) is designated as a ×8 DQS bus for DDR (×9 for QDR). Similarly, a DQS bus 112 and 120 transmitting the data strobe signal from each DQS pin 110 to sixteen data DQ pins is designated as a ×16 for DDR (×18 for QDR) bus. Typically, the fixed data strobe signal buses 112 and 120 are configured to operate in ×8, ×6, and ×32 (for DDR) modes. These modes correspond to the fixed data strobe signal buses 112 and 120 being coupled to one, two, and four I/O modules respectively. In one embodiment, the fixed ×32 DQS 112 bus of the first integrated circuit is provided for use with different semiconductor packages.

In one scenario, vertical migration from the second integrated circuit 100a to the first integrated circuit 100b using the same semiconductor package can be achieved by one to one direct migration of all the DQ pins associated with the I/O modules 118 with DQS pins 110 of the second IC 100a to the DQ pins of the corresponding I/O modules 118 of the first IC 100b. In this scenario, the fixed data strobe signal buses 120 providing the data strobe signal to more than one I/O module 118 of the second integrated circuit 100a is mapped to the flexible data strobe signal bus 114 of the first integrated circuit 100b. For example, the fixed ×16 DQS buses 120 of the second integrated circuit 100a providing the data strobe signal to two I/O modules 118 (e.g. IO1 and IO2) is mapped to the flexible DQS bus 114 of the first integrated circuit 100b, such that the flexible DQS bus transmits the data strobe signal to the corresponding I/O modules 118 of the first IC 100b (i.e.

IO2 and IO4). In one embodiment, the flexible data strobe signal bus 114 provides the data strobe signal to I/O modules 116 with the DQS pin 110.

The flexible DQS bus 114 of the first integrated circuit 100b is configured during the synthesis and place and route phases of the design to provide the data strobe signal to a number of I/O modules 116 defined by the configuration of a corresponding fixed data strobe signal bus 120 of the second IC 100a. In one embodiment, the I/O modules 116 of the first IC 100b having a DQS pin 110 are placed in groupings such that each grouping contains a minimum number of input/output modules 116 needed to include the DQS pins 110. I/O modules 116 (e.g. IO1) that are not needed to span the DQS pins 110 are excluded from the groupings, thereby reducing the resistance/capacitance delay of the flexible data strobe signal bus 114. In one embodiment, the groupings of I/O modules 116 of the first IC 100b are formed exclusively using the I/O modules 116 with an associated data strobe pin (i.e. IO2 and IO4). In one grouping, the flexible data strobe signal bus 114 spans IO2-IO4 and encompassing the DQS pins 110 associated with I/O modules 116 IO2 and IO4. Another I/O module 116 grouping spans IO5-IO7.

Figure 3:
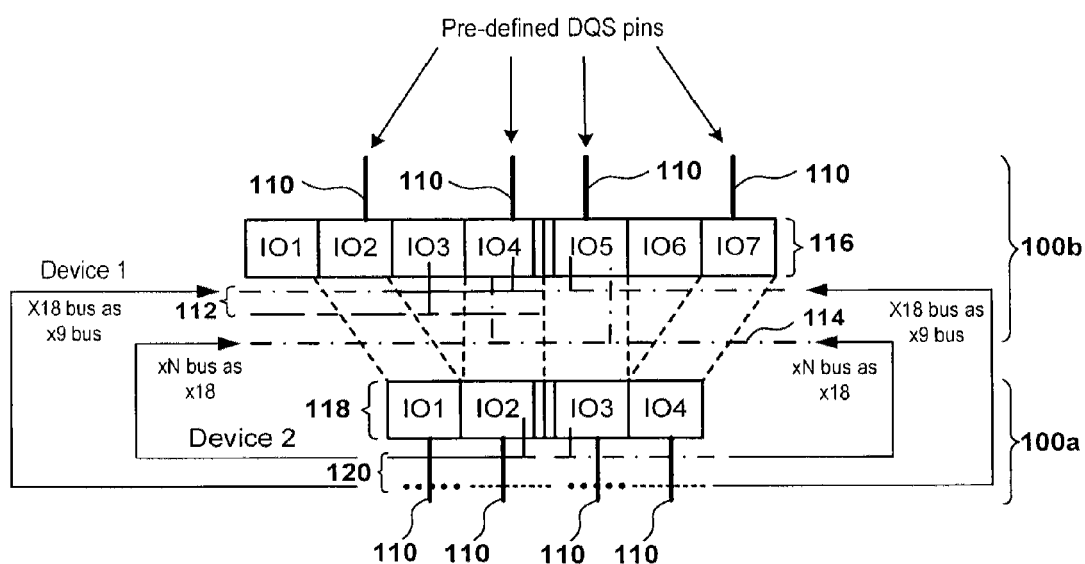
FIG. 3 illustrates distributed migration of input/output modules with a data strobe pin from an integrated circuit to another integrated circuit with an increased number of input/output modules using a flexible data bus in accordance with one embodiment of the present invention.

FIG. 3 illustrates distributed migration of input/output modules with a data strobe pin from an integrated circuit to another integrated circuit with an increased number of input/output modules using a flexible data bus in accordance with one embodiment of the present invention. Referring to FIG. 2, one to one direct migration of the DQ pins from the I/O modules 118 of the second integrated circuit 100a to the DQ pins of the corresponding I/O modules 116 of the first integrated circuit 100b can be accomplished if the positions of the DQ pins of the first IC 100b will accommodate wirebonding that conforms to the bond wire limitation angle of the semiconductor package. In cases where the positions of the DQ pins do not accommodate bond wires which conform to the bond wire limitation angle, the DQ pins of the second IC 100a can alternately to be distributed to a subset of DQ pins of more than one I/O modules 116 of the first IC 100b.

In this scenario, the data pins of each I/O module 118 of the second integrated circuit 100a are mapped to DQ pins associated with more than one I/O module 116 of the first integrated circuit 100b. Mapping each input/output module 118 of the second integrated circuit 100a to more than one I/O module of the first integrated circuit 100b allows the subset of the data pins associated with the I/O modules 116 having a data strobe pin 110 to be coupled to the top surface of the semiconductor package through bond wires complying with the bond wire limitation angle. The fixed DQS buses 120 of the second IC 100a are mapped to the flexible data strobe signal bus 114 of the first IC 100b, which enabling the data strobe signal to be transmitted to the subset of data pins associated with the flexible DQS bus 114.

In one embodiment, the flexible data strobe signal bus 114 spans a number of I/O modules 116 to include a plurality of data strobe pins 110 and transmits the data strobe signal from an I/O module 116 (104) to the associated subset of data pins. For instance, the flexible DQS bus 114 can span I/O modules 116 IO1 through IO4, which includes two data strobe pins 110. In this scenario, the data pins of IO1 118 of the second integrated circuit 100a are mapped to a subset of data pins associated with IO1 and IO2 116 of the first integrated circuit 100b. In addition, the data pins of IO2 118 of the second IC 100a are distributed to a subset of data pins associated with IO3 and IO4 116 of the first IC 100b. The flexible data strobe signal bus 114 enables the data strobe signal received by IO4 116 of the first IC 116 to be transmitted to the subset of DQ pins associated with the flexible DQS bus 114 and I/O modules 118 IO1-IO4. The number of DQ pins associated with the flexible data strobe signal bus 114 is defined by the number of DQ pins associated with the corresponding fixed DQS bus 120 of the second IC 100a. In contrast, the fixed DQS buses 112 are coupled to a set configuration of I/O modules 116 and transmit the data strobe signal to the DQ pins of the configured grouping of I/O modules 116.

The selection of the subset of data pins associated with the I/O modules 116 of the first integrated circuit 100b is enabled through the use of the flexible data bus 114, where the number of DQ pins is defined by the fixed DQS bus 120 of the corresponding I/O modules 118 of the second integrated circuit 100a. For instance, the flexible data strobe signal bus 114 enables mapping the DQ pins associated with I/O modules 118 IO3-IO4 of the second IC 100a to twenty-four available data pins of I/O modules 116 IO5-IO7 of the first IC 100b. For proper vertical migration from the second integrated circuit 100a to the first integrated circuit 100b using the same semiconductor package, the DQ groupings associated with each data strobe pin 110 should have the same number of DQ pins for both the first IC 100b and the second IC 100a. For example, input/output modules 118 IO3-IO4 of the second integrated circuit 100a is coupled to a ×16 DQS bus with sixteen DQ pins, such that sixteen of the twenty-four DQ pins in I/O modules 116 IO5-IO7 coupled with the flexible DQS bus 114 of the first integrated circuit 100b should be selected to be mapped to the DQ pins of I/O modules 118 IO3-IO4 of the second integrated circuit 100a.

In another embodiment, the DQS buses 114 and 116 of the FPGA chips 100a and 100b are coupled to a number of multiplexers. The multiplexers couple a selected DQS bus, either one of the fixed DQS buses 112 or the flexible DQS bus 114 to transmit the data strobe signal to the input/output modules 116 and 118. The selection signal of the multiplexers is an output from a configuration shift register in one embodiment. The data strobe signal buses 112, 114, and 120 may also include buffers for buffering the data strobe signal transmitted on the DQS buses 112, 114 and 120.

Figure 4:
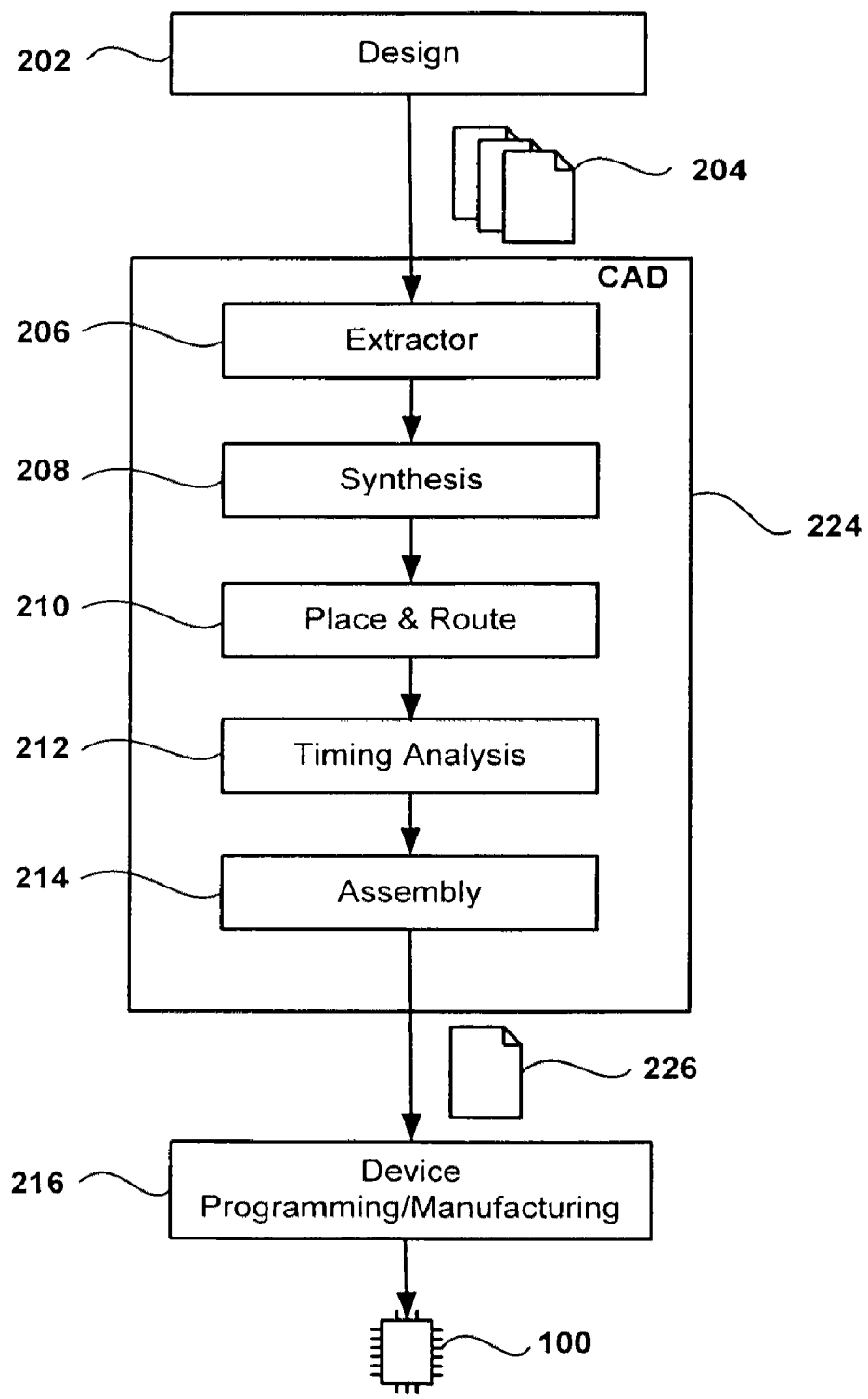
FIG. 4 illustrates the method operation involved in the design or manufacture of an integrated circuit using a computer aided design tool in accordance with one embodiment of the present invention.

FIG. 4 illustrates the method operation involved in the design or manufacture of an integrated circuit using a computer aided design tool in accordance with one embodiment of the present invention. The process starts with design 202 produced by a hardware engineer that creates HDL files 204 containing the desired circuitry description. Initially, extractor 206 parses HDL files 204 and creates a basic discrete netlist of logic-gate primitives, followed by synthesis 208 phase that optimizes the basic netlist. The place and route 210 operation follows synthesis 208. In one embodiment, configuration of the flexible DQS bus described above is implemented in the synthesis operation 208 and the place and route 210 of the process to manufacture an integrated circuit 100 using a computer aided design (CAD) tool 224.

Following the place and route 210 operation, timing analysis 212 computes the lengths of paths in the circuits and how the delays relate to the constraints of the circuit, and is followed by the assembly operation 214. As a result, the CAD tool 224 produces binary file 226 with a description of the circuit to be used during device programming/manufacturing 218 of the integrated circuit 100. The resulting binary file 226 of the integrated circuit 100 with the flexible data strobe signal bus is stored in non-volatile memory for later retrieval by the device programming or manufacturing process 216. The integrated circuit 100 is produced during the device programming or manufacturing process 216 according to the instructions, also referred to as layout, for the integrated circuit 100 found in design binary file 226. One skilled in the art will appreciate that any commercially available electronic design automation tool may utilize the embodiments described herein.

Figure 5:
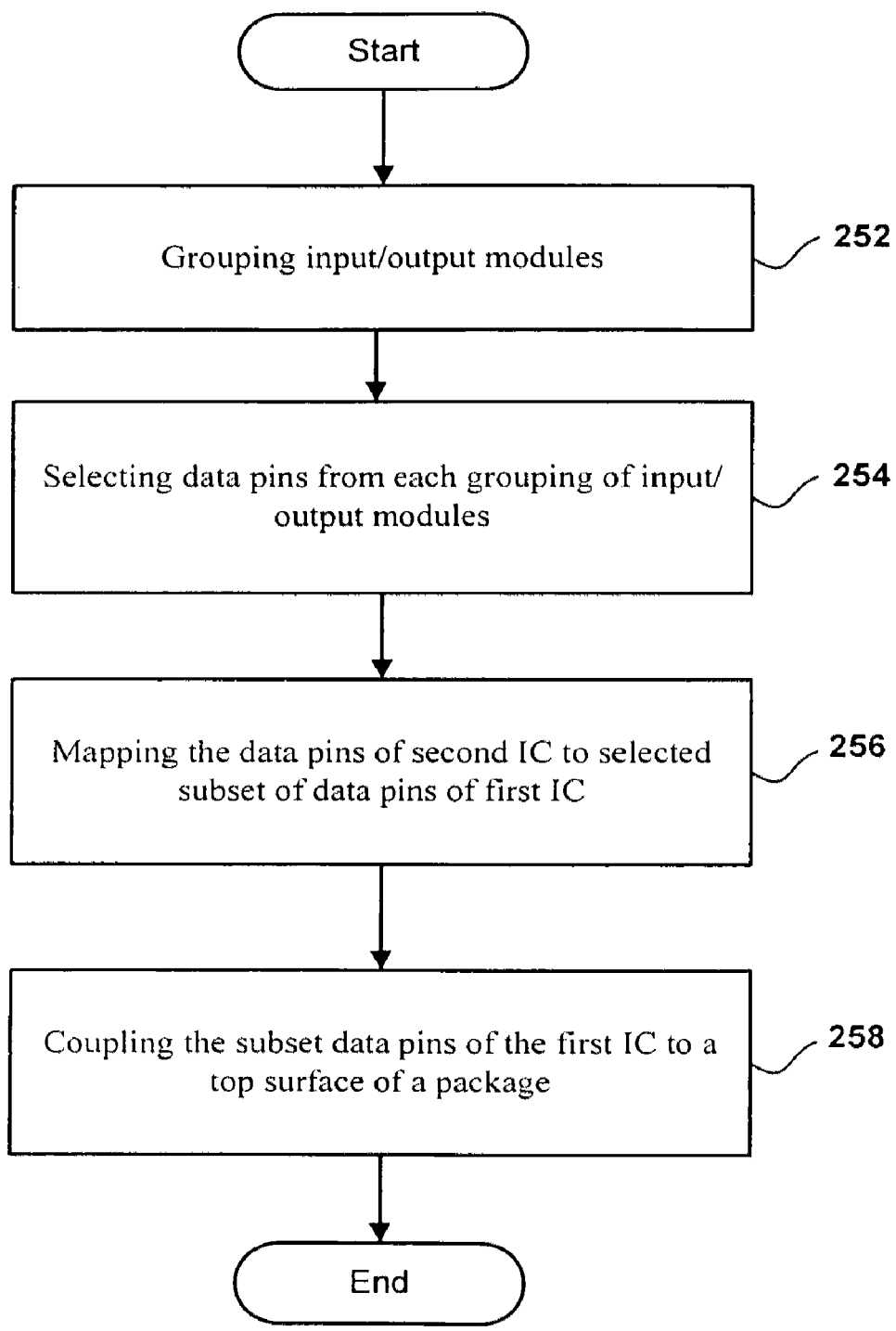
FIG. 5 illustrates the method operations enabling vertical migration between integrated circuits of different sizes and number of input/output pins in the same semiconductor package using a flexible data bus in accordance with one embodiment of the present invention.

FIG. 5 illustrates the method operations enabling vertical migration between integrated circuits of different sizes and number of input/output pins in the same semiconductor package using a flexible data bus in accordance with one embodiment of the present invention. The design process starts in operation 252, where the input/output modules of the first integrated circuit are organized into groupings. Each grouping spans a number of data strobe pins and is coupled to an associated flexible data bus. As illustrated in FIG. 3, the flexible DQS bus has groupings of I/O modules IO1-IO4 and IO5-IO7. In one embodiment, each grouping of I/O modules includes the minimum number of I/O modules that spans the DQS pins of the grouping, i.e. IO2 and IO4 as shown in FIG. 2.

The method advances to operation 254 in which each grouping of input/output modules of the first integrated circuit is coupled to the associated flexible data strobe signal bus, as illustrated in FIG. 2. In operation, 256, a subset of data pins from each grouping of input/output modules of the first integrated circuit is selected, where the selection is enabled through the flexible DQS bus. In one embodiment, the flexible DQS bus spans a larger number of I/O modules than the number of I/O modules associated with the corresponding fixed DQS bus of the second IC, as illustrated in FIG. 2. The number of data pins in the subset should be the same as the number of DQ pins of the corresponding fixed DQS bus of the second IC. In another embodiment, the flexible DQS bus is defined by a fixed DQS bus coupled to the corresponding I/O module of the second integrated circuit.

The method advances to operation 256, where the data pins of a corresponding input/output module on the second IC are mapped to the selected subset of data pins from each grouping, where the data pins from the first IC are correlated to a corresponding data pin of the second IC. In one embodiment, the corresponding input/output module on the second IC is coupled to an associated fixed data bus, as shown in FIG. 2. In another embodiment, operations 252-256 can occur in the synthesis phase of the integrated circuit design of FIG. 4. In operation 258, the subset of data pins of the first integrated circuit is coupled to the top surface of the semiconductor package through use of conductive lines, where the conductive lines are coupled at a coupling angle that is less than the bond wire limitation angle, as illustrated in FIG. 1B.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

The method and apparatus described herein may be incorporated into any suitable circuit, including processors and programmable logic devices (PLDs). The PLDs can include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by ALTERA CORPORATION.

Although the foregoing invention has been described in some detail for purposes of clarity of understanding, it will be apparent that certain changes and modifications can be prac-

What is claimed is:

1. A first integrated circuit contained in a semiconductor package, the first integrated circuit comprising:
a plurality of input/output (I/O) modules, each I/O module including a plurality of data pins to receive and transmit data, a subset of the I/O modules having a data strobe pin;
a plurality of fixed data strobe signal buses coupled to the plurality of I/O modules, each fixed DQS bus having a fixed configuration that correlates a number of data pins with a corresponding data strobe pin, wherein the data strobe pin spans multiple I/O modules; and
a flexible data strobe signal (DQS bus coupled to the plurality of I/O modules, the flexible DQS bus enabling selection of a subset of the number of data pins of the first integrated circuit which map to a plurality of data pins of corresponding I/O modules of a second integrated circuit contained in the semiconductor package, wherein the second integrated circuit has a different number of I/O modules than a number of the plurality of I/O modules of the first integrated circuit.

2. The first integrated circuit of claim 1, wherein the flexible DQS bus is configured to transmit the data strobe signal to a number of data pins associated with a corresponding fixed DQS bus of the second integrated circuit.

3. The first integrated circuit of claim 1, further comprising:
a plurality of conductive lines providing electrical communication between the subset of data pins of the first integrated circuit with a top surface of the semiconductor package, the conductive lines being coupled at an angle less than a bond wire limitation angle.

4. The first integrated circuit of claim 3, wherein the bond wire limitation angle is less than 45 degrees.

5. The first integrated circuit of claim 1, wherein each fixed DQS bus transmits the data strobe signal to the data pins of the fixed configuration of input/output modules.

6. The first integrated circuit of claim 1, wherein the plurality of input/output modules of claim 1, comprises:
a differential data strobe signal pin.

7. The first integrated circuit of claim 1, wherein the first integrated circuit is a synchronous dynamic random access memory.

8. The first integrated circuit of claim 1, wherein the second integrated circuit is a synchronous dynamic random access memory with less memory than the first integrated circuit.

9. The first integrated circuit of claim 1, wherein the first integrated circuit is a programmable logic device.

10. The first integrated circuit of claim 1, wherein the first integrated circuit is incorporated into a wirebond package.

11. The first integrated circuit of claim 1, wherein the first integrated circuit is incorporated into a flip chip package.

12. A first integrated circuit contained in a semiconductor package designed by a process, comprising:
organizing a plurality of input/output modules into groupings which span a plurality of data strobe pins of the first integrated circuit;
coupling each grouping of input/output modules to an associated flexible data strobe signal bus;
selecting a subset of data pins from each grouping of input/output modules;
correlating a plurality of data pins of a input/output module on a second integrated circuit contained in the semiconductor package to the selected subset of data pins from each grouping of input/output modules, wherein the second integrated circuit has a different number of I/O modules than a number of the plurality of I/O modules of the first integrated circuit; and
storing the design of the first integrated circuit for fabrication.

13. The first integrated circuit of claim 12, wherein selection of the subset of data pins is enabled through the flexible data strobe signal bus, the flexible DQS bus is defined by a fixed DQS bus coupled to the corresponding input/output module on the second integrated circuit.

14. The first integrated circuit of claim 12, further comprising:
coupling the selected subset of data pins from the first integrated circuit to a top surface of the semiconductor package.

15. The first integrated circuit of claim 14, wherein coupling the selected subset of data pins from the first integrated circuit to the top surface of the semiconductor package is implemented using a plurality of conductive lines, the conductive lines being coupled at an angle less than a bond wire limitation angle.

16. The first integrated circuit of claim 12, further comprising:
selecting a DQS bus from a plurality of fixed DQS buses and the flexible DQS bus to carry a data strobe signal to the plurality of input/output modules of the first integrated circuit, the selection defined by an output from a configuration shift register.

17. The first integrated circuit of claim 12, further comprising:
multiplexing a data strobe signal from a selected data strobe signal bus to the plurality of input/output modules of the first integrated circuit though a plurality of multiplexers.

18. The first integrated circuit of claim 12, further comprising:
buffering a data strobe signal transmitted on the plurality of DQS buses using a plurality of buffers coupled to each DQS bus of the first integrated circuit.

19. The first integrated circuit of claim 12, wherein the first integrated circuit is configured to be incorporated into both a wirebond package and a flip chip package.

* * * * *